(12) United States Patent
Park et al.

(10) Patent No.: US 10,296,480 B2
(45) Date of Patent: May 21, 2019

(54) DATA PROCESSING SYSTEM HAVING COMBINED MEMORY BLOCK AND STACK PACKAGE

(71) Applicant: SK hynix Inc., Gyeonggi-do (KR)

(72) Inventors: Hae Chan Park, Gyeonggi-do (KR); Sung Cheoul Kim, Gyeonggi-do (KR); Tae Ho Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 3 days.

(21) Appl. No.: 15/063,012

(22) Filed: Mar. 7, 2016

(65) Prior Publication Data

US 2016/0210235 A1    Jul. 21, 2016

Related U.S. Application Data

(63) Continuation-in-part of application No. 13/339,954, filed on Dec. 29, 2011, now Pat. No. 9,552,874.

(30) Foreign Application Priority Data

Oct. 20, 2011  (KR) .................. 10-2011-0107635

(51) Int. Cl.
*G06F 12/02* (2006.01)
*G06F 13/40* (2006.01)
(Continued)

(52) U.S. Cl.
CPC ........ *G06F 13/4022* (2013.01); *G11C 11/005* (2013.01); *G11C 11/5607* (2013.01); *G11C 11/5678* (2013.01); *G11C 13/0004* (2013.01); *G11C 16/06* (2013.01); *G06F 2212/451* (2013.01); *G11C 2211/5641* (2013.01); *G11C 2211/5642* (2013.01); *G11C 2213/71* (2013.01);
(Continued)

(58) Field of Classification Search
None
See application file for complete search history.

(56) References Cited

U.S. PATENT DOCUMENTS 4,811,303 A * 3/1989 Hirai .................... G11C 11/005
 235/380
6,510,099 B1 * 1/2003 Wilcox ............... G06F 13/1673
 365/189.05

(Continued)

FOREIGN PATENT DOCUMENTS

CN      1649158      8/2005

*Primary Examiner* — Charles Rones
*Assistant Examiner* — Ryan Dare
(74) *Attorney, Agent, or Firm* — IP & T Group LLP

(57) ABSTRACT

A data processing system includes a central processing unit (CPU), a control block configured to interface with the CPU, a cache memory configured to interface with the control block and arranged to be spaced from the CPU by a first distance, and a combined memory block configured to interface with the control block, arranged to be spaced from the CPU by a second distance larger than the first distance, and configured of a working memory and a storage memory. The combined memory block is configured of a plurality of stacked memory layers, each configured of a plurality of variable resistance memory cells. The working memory is allocated to one memory layer selected among the plurality of memory layers. The storage memory is allocated to remaining memory layers among the plurality of memory layers.

16 Claims, 6 Drawing Sheets

(51) Int. Cl.
  *G11C 11/56* (2006.01)
  *G11C 13/00* (2006.01)
  *G11C 16/06* (2006.01)
  *G11C 11/00* (2006.01)

(52) U.S. Cl.
  CPC .......... *G11C 2213/79* (2013.01); *Y02D 10/14* (2018.01); *Y02D 10/151* (2018.01)

(56) References Cited

U.S. PATENT DOCUMENTS

| | | | | |
|---|---|---|---|---|
| 8,812,899 B1* | 8/2014 | Fultz | ............... | G06F 12/0886 714/6.1 |
| 2007/0058410 A1* | 3/2007 | Rajan | ............... | G11C 5/02 365/63 |
| 2007/0288687 A1* | 12/2007 | Panabaker | ............... | G06F 13/1615 711/103 |
| 2008/0229026 A1 | 9/2008 | Chung | | |
| 2010/0226165 A1 | 9/2010 | Kang et al. | | |
| 2010/0315866 A1* | 12/2010 | Park | ............... | G11C 11/5678 365/163 |
| 2011/0038194 A1* | 2/2011 | Murata | ............... | G11C 5/063 365/63 |
| 2011/0194336 A1 | 8/2011 | Mouli | | |

\* cited by examiner

DATA PROCESSING SYSTEM HAVING COMBINED MEMORY BLOCK AND STACK PACKAGE

CROSS-REFERENCES TO RELATED APPLICATION

This application is a continuation-in-part of application Ser. No. 13/339,954, filed Dec. 29, 2011, titled "Combined memory block and data processing system having the same" and claims priority under claims priority under 35 U.S.C. 119(a) to Korean application number 10-2011-0107635, filed on Oct. 20, 2011 in the Korean Patent Office and which is incorporated herein by reference in its entirety as if set forth in full.

BACKGROUND OF THE INVENTION

1. Technical Field

The exemplary embodiments of the present invention relate to a semiconductor integration circuit apparatus and more particularly, to a data processing system and a method of operation thereof.

2. Related Art

Generally, memory devices may be classified into random access memories (RAMs), and read only memories (ROMs). RAMs are volatile memories that lose stored data upon power off, while ROMS are nonvolatile memories that retain stored data even when power is turned off. Dynamic RAM (DRAM) devices are widely used RAMs and flash memory devices are widely used ROMs.

DRAM devices may generally be advantageous as compared to flash memories due to their higher speed operation from having easier random data access. However, DRAMs may generally require more refresh operations due to their volatile property and may also employ larger capacity capacitors than flash memories.

Moreover, flash memory devices may allow for higher integration density than DRAM devices. However, flash memory devices may use a higher operation voltage due to having a stack structure of two gates as compared to DRAMS which may use a power voltage and separate boosting circuits for generating voltages for read and write operations. In addition, since it is difficult to randomly access flash memory devices, a program operation may be performed on a page unit basis and thus the operation speed of flash memory devices may be relatively slow.

As the sizes of semiconductor memory devices gradually decrease, the implementation of a system on chip (SOC) in which function blocks having various functions are integrated on one chip is becoming more popular.

More specifically, an SOC data processing system has a structure in which basic memories and various types of memories and non-memory chips of different functions may be combined. However, since chips having different driving conditions may be mounted in an SOC data processing system, separate driving circuits may be used and thus the complexity and cost of a manufacturing process thereof may increase.

SUMMARY

According to one aspect of an exemplary embodiment, a data processing system may include: a central processing unit (CPU); a control block configured to interface with the CPU; a cache memory configured to interface with the control block and arranged to be spaced from the CPU by a first distance; and a combined memory configured to interface with the control block, arranged to be spaced from the CPU by a second distance larger than the first distance, and configured of a working memory and a storage memory. The combined memory may be configured of a plurality of stacked memory layers, each configured of a plurality of variable resistance memory cells. The working memory may be allocated to one memory layer selected from among the plurality of memory layers. The storage memory may be allocated to remaining memory layers among the plurality of memory layers.

According to an aspect of an exemplary embodiment, a data processing system may include: a central processing unit (CPU); and a combined memory block configured to substantially interface with the CPU and including a working memory and a storage memory. The working memory and the storage memory may be configured to be stacked.

According to an aspect of an exemplary embodiment, a stack package may include: a printed circuit board (PCB); a central processing unit (CPU) chip mounted on the PCB; and a combined memory chip stacked on the CPU chip and including a working memory and a storage memory.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
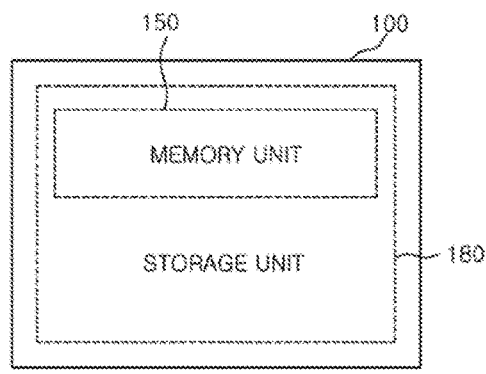
FIG. 1 is a block diagram illustrating a combined memory block of a data processing system according to an exemplary embodiment of the present invention.

Hereinafter, exemplary embodiments will be described in greater detail with reference to the accompanying drawings. It is noted that the drawings are simplified illustrations of various embodiments and intermediate structures. As such, actual sizes and proportions of implemented exemplary embodiments may vary from the illustrated sizes and proportions. Further, exemplary embodiments should not be construed as limited to the particular shapes of regions illustrated herein but construed to include deviations in shapes that result from actual implementations. Moreover, in the drawings lengths and sizes of layers and regions may be exaggerated for clarity. Also, generally like reference numerals in the drawings denote like elements. It is also understood that when a layer is referred to as being another layer or substrate, it may be directly on the other or substrate, or intervening layers may also be present.

Referring now to FIG. 1, a combined memory block 100 including a memory block/unit 150 and a storage block/unit 180 is provided, according to an embodiment of the present invention.

Figure 2:
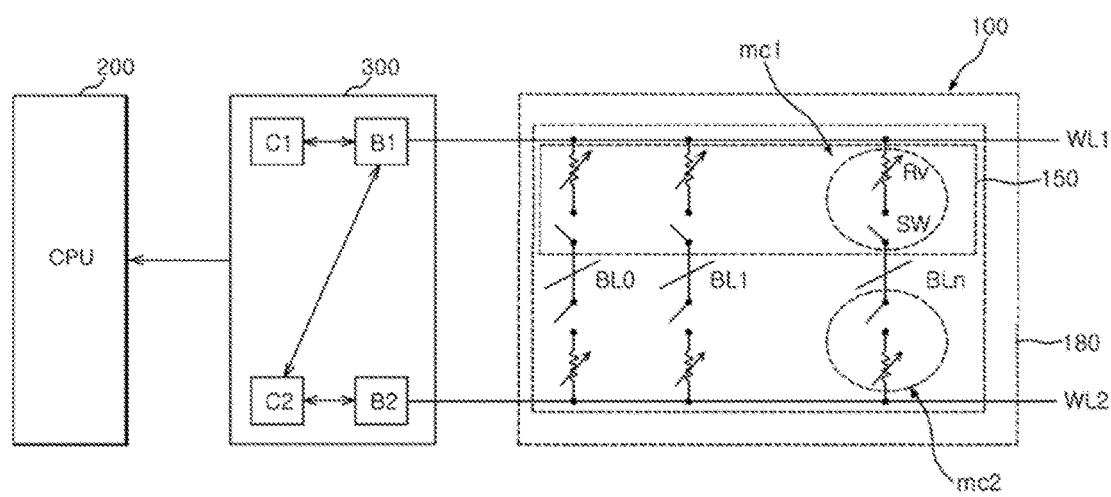
FIG. 2 is a block diagram illustrating a data processing system according to an exemplary embodiment of the present invention.

When data used by a central processing unit (CPU) (200 of FIG. 2) is not in the memory block/unit 150 of the combined memory block 100, the CPU 200 may transmit a command and address to a control block (300 of FIG. 2). The control block 300 may then write the input command and address in the storage block 180 according to an interface method. Any suitable interface method may be used. The interface method may be set according to design.

The storage block 180 may then upon reception of the respective command and address from the control block 300 may automatically perform a read/write operation. Page data read from a memory core (not shown) of the storage block 180 may be stored temporarily in a page buffer disposed within the storage block 180. The page data stored in the page buffer may be transmitted to the memory unit 150 in fixed amounts of data. When the data has been transmitted to the memory unit 150, may then also be received by the CPU 200 in turn.

The storage block 180 may be or include any suitable memory device. The storage block may have a high data processing speed and/or a long operational lifetime. The memory unit 150 may be a memory device having easy random access and low power consumption. The storage block may have a higher data processing speed, a longer operational lifetime easier random access and lower power consumption than the memory unit 150. In an embodiment, the storage block 180 may be a memory device including a plurality of memory cell arrays and a page buffer.

Figure 4:
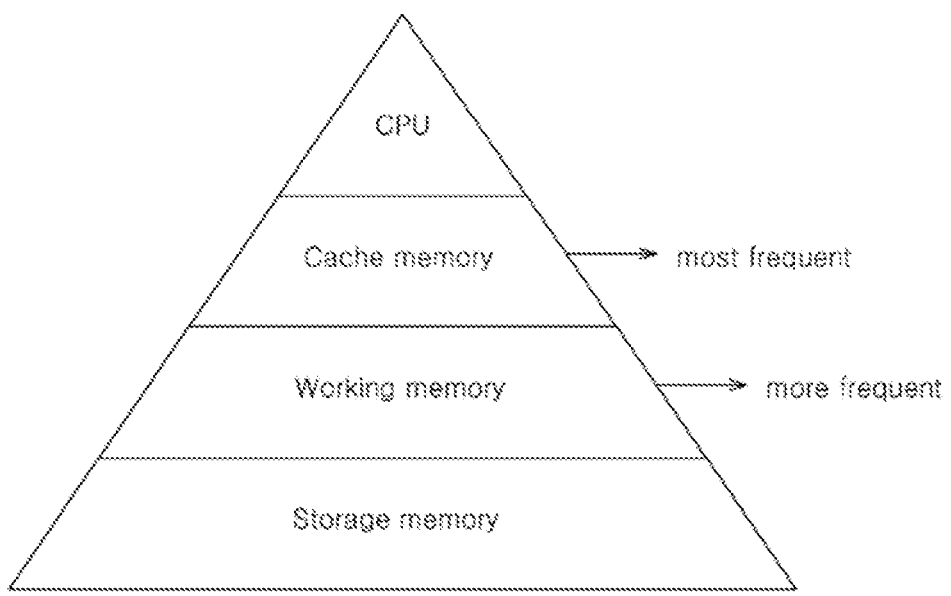
FIG. 4 is a memory hierarchy diagram illustrating a data processing system, according to an exemplary embodiment of the present invention.

As illustrated in FIG. 4, a data processing system according to an embodiment of the invention may also include a cache memory configured to most frequently interface data with the CPU 200. The memory device may further include a working memory corresponding to the memory unit 150 of FIG. 1 and a storage memory corresponding to storage unit 180 of FIG. 1. Hence, in an embodiment, the memory unit 150 may be or include a working memory configured to interface data with the CPU 200 less frequently than the cache memory, but more frequently than the storage memory. Moreover, since the cache memory uses the most frequently used data as described above, the cache memory may require the highest data processing speed. The cache memory may be arranged closest to the CPU 200. The combined memory block 100 may thus be positioned farther from the CPU than the cache memory. The working memory may have slower data processing speed than the cache memory.

The memory unit 150 and the storage block 180 according to an exemplary embodiment may be configured of memory cells each having variable resistance. According to an example, the memory unit 150 may be a part of the storage block 180.

The memory unit 150 as the working memory may control address mapping of the storage block 180 and allow easier random access and low power consumption. Thus, in an embodiment, the memory unit 150 may include a plurality of single-level variable resistance cells (SLC) capable of implementing 2-bit operation.

Figure 3:
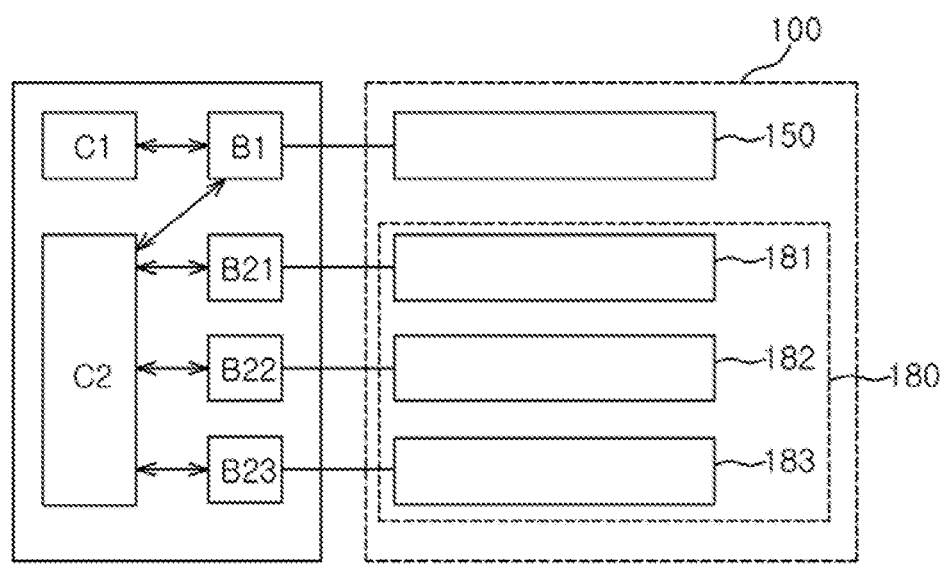
FIG. 3 is a block diagram illustrating a data processing system, according to an exemplary embodiment of the present invention.

Preferably, the storage block 180 may include a plurality of memory cell arrays that use a multi-level variable resistance cell (MLC) capable of implementing multi bit storage for storing a large amount of data. For example, MLCs may be implemented by combining SLCs including SLCs of the memory unit 150 or by using true MLCs as described below in connection with FIG. 3.

In an embodiment, a variable resistance memory cell may include a phase-change memory cell. Alternatively, a resistive RAM (ReRAM) cell or a spin transfer torque magnetoresistive RAM (STTMRAM) cell may be used.

Figure 5:
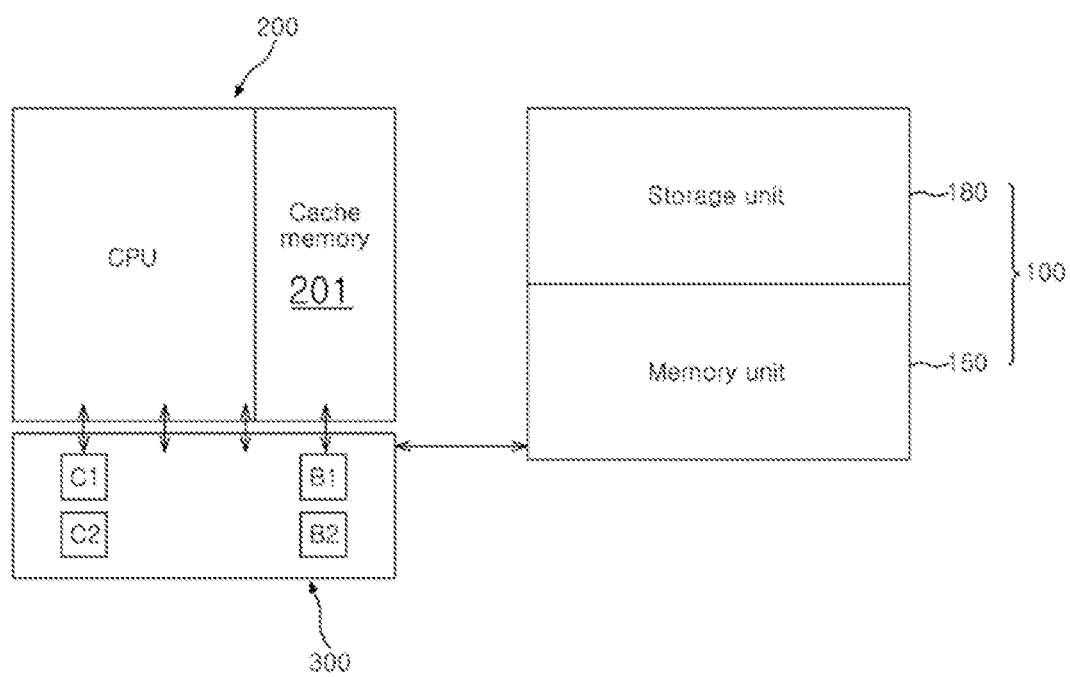
FIG. 5 is a block diagram illustrating a data processing system, according to an exemplary embodiment of the present invention.

The data processing system will be described in more detail with reference to FIG. 2 and FIG. 5. Accordingly, the data processing system may include a CPU 200, a control block 300, and a combined memory block 100.

The CPU 200 may be arranged closer to the cache memory 201 and the CPU 200 and the cache memory 201 may interface with the control block 300.

The control block 300 may interface between the CPU 200 and the combined memory block 100. The control block 300 may include controllers C1 and C2 and buffers B1 and B2. For example, the controllers C1 and C2 may provide input command and address to the buffers B1 and B2. The control block 300 in an exemplary embodiment may include a first and second controllers C1, C2 and a first and second buffers B1, B2. For example the first buffer B1 may interface between the first and second controllers C1 and C2 and the second buffer B2 may interface with the second controller C. The first and second buffers B1 and B2 may buffer voltages received from the first and/or second controller C1 and C2 and transmit the buffered voltages to the combined memory block 100. It is noted that in the embodiment illustrated herein, the control block 300 includes first and second controllers C1 and C2 and first and second buffers B1 and B2, however, the control block 300 is not limited thereto. For example, the control block 300 may include a plurality of controllers and a plurality of buffers. At least one of the controllers may be a memory controller configured to provide a signal for controlling the combined memory block 100.

As described above, the combined memory block 100 may include the memory unit 150 having a working memory function and the storage unit 180 having a simple data storage function. The memory unit 150 may be formed of a DRAM device, and the storage unit 180 may be formed of a NAND flash device. However, in a preferred embodiment, both the memory unit 150 and the storage unit 180 may be formed or be configured of a plurality of variable resistance memory cells.

The memory unit 150 and the storage unit 180 may be configured in a stack form including memory layers on top of one another.

For example, the combined memory block 100 may include a pair of word lines WL1 and WL2 as shown in FIG. 2. A first word line WL1 may be electrically connected to the first buffer B1, and a second word line WL2 may be electrically connected to the second buffer B2. Here, the buffers B1 and B2 may correspond to respective word lines WL1 and WL2. The controller C1 may control the memory unit 150 and the controller C2 may control the storage unit 180, according to their functions.

A plurality of bit lines BL0 to BLn may be included between the first word line WL1 and the second word line WL2. The plurality of bit lines BL0 to BLn may be disposed in a direction crossing the first and second word lines WL1 and WL2. A first variable resistance cell mc1 configured of a variable resistor Rv and a switch SW, (i.e., access device)

may be connected between the first word line WL1 and a corresponding bit line among of the plurality of bit lines BL0 to BLn. A second variable resistance cell mc2 configured of a variable resistor Rv and a switch SW, may be connected between a corresponding bit line among the plurality of bit lines BL0 to BLn and the second word line WL2

Here, the first variable resistance cells mc1 may correspond to the memory unit 150 of the combined memory block 100 while the second variable resistance cells mc2 may correspond to the storage unit 180. The storage unit 180 may be composed of the first and second variable resistance cells mc1 and mc2.

In an embodiment, each of the first and second variable resistance cells mc1 and mc2 may be or be formed of a phase-change memory cell. In another embodiment, each of the first and second variable resistance cells mc1 and mc2 may be or formed of a resistive memory cell or a magnetoresistive memory cell depending on a material constituting a resistor of the memory cell. The switch SW may be or constituted of at least one of a diode, a planar type transistor, a three-dimensional transistor, an ovonic threshold switch (OTS), and the like.

As shown in FIG. 2, the first and second variable resistance cells mc1 and mc2 may be configured in a stacked form with respect to each other. The word lines WL1 and WL2 may also be configured in a stacked form with the bit lines BL0 to BLn being interposed between the stacked word lines WL1 and WL2.

The memory unit 150 may be configured in a SLC type to perform 2-bit operations quickly like DRAMs and to perform program and verify operations relatively easily.

The storage unit 180 may have memory cells, each memory cell being configured as an MLC, for example, by stacking the first and second variable resistance cells mc1 and mc2 and connecting the first and second variable resistance cells mc1 and mc2 to the first and second word lines WL1 and WL2, respectively, for storing multiple-level data. Although the storage unit 180 may be configured as an MLC type and may use a large program and verify time compared to the memory unit 150, the storage unit 180 may perform program and verify operations at high speed.

The storage unit 180 implemented with the multi-level variable resistance cells mc1 and mc2 may be controlled by the first and second word lines, respectively, to cause the first variable resistance cells mc1 to be driven as part of the memory unit 150 or as part of the storage unit 180.

The memory unit 150 and the storage unit 180 configured of the variable resistance cells may be configured to be stacked so that the area occupied by the data processing system may be reduced.

Figure 6:
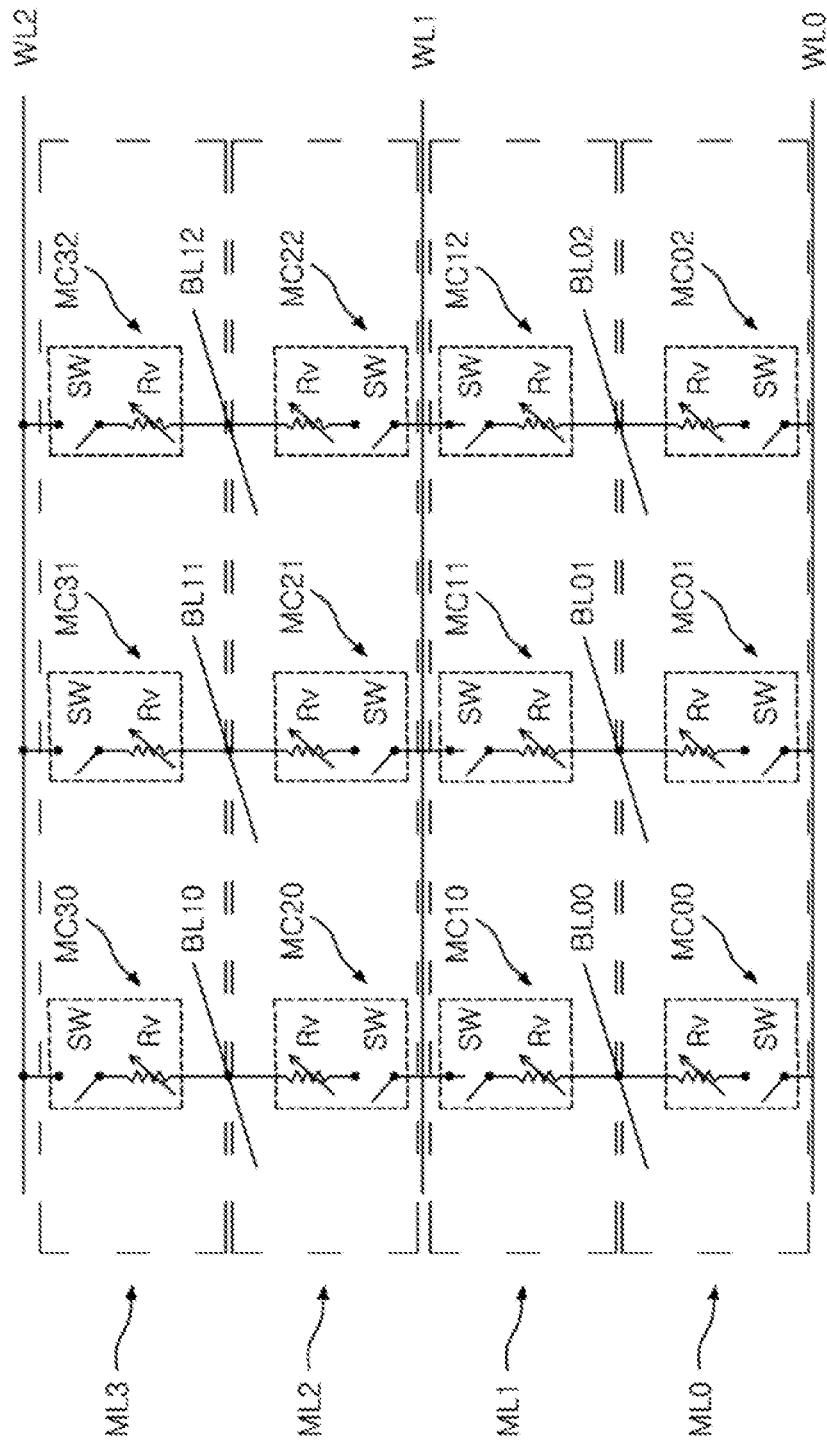
FIG. 6 is a detailed circuit diagram illustrating a combined memory block, according to an exemplary embodiment of the present invention.

As illustrated in FIG. 6, the combined memory block 100 may include a plurality of stacked memory layers ML0 to ML3. The first memory layer ML0 may include a plurality of first-layer variable resistance cells MC00 to MC02. The plurality of first-layer variable resistance cells MC00 to MC02 may be coupled between a first word line WL0 and a plurality of first-layer bit lines BL00 to BL02 arranged over the first word line WL0. The plurality of first-layer bit lines BL00 to BL02 may be arranged on the same plane to be spaced apart at a certain interval from each other and may extend to a direction crossing the first word line WL0. Each of the plurality of first-layer variable resistance cells MC00 to MC02 may include a switch SW coupled to the first word line WL0 and a variable resistor Rv coupled between the switch SW and a corresponding first-layer bit line among the first-layer bit lines BL00 to BL02. The variable resistor Rv may be a phase-change memory layer.

The second memory layer ML1 may be stacked on the first memory layer ML0. Like the first memory layer ML0, the second memory layer ML1 may include a plurality of second-layer variable resistance cells MC10 to MC12. The plurality of second-layer variable resistance cells MC10 to MC12 may be coupled between the plurality of first-layer bit lines BL00 to BL02 and a second word line WL1. The second word line WL1 may be arranged over the plurality of first-layer bit lines BL00 to BL02 and may extend to a direction crossing the plurality of first-layer bit lines BL00 to BL02. The second word line WL1 may extend substantially in parallel to the first word line WL0. Each of the plurality of second-layer variable resistance cells MC10 to MC12 may include a variable resistor Rv coupled to a corresponding first-layer bit line among the first-layer bit lines BL00 to BL02 and a switch SW coupled to the variable resistor Rv and the second word line WL1. That is, the second-layer variable resistance cells MC10 to MC12 may be symmetrically arranged with the first-layer variable memory cells MC00 to MC02 with respect to the first-layer bit lines BL00 to BL02.

The third memory layer ML2 may be stacked on the second memory layer ML1, and include a plurality of third-layer variable resistance cells MC20 to MC22. The plurality of third-layer variable resistance cells MC20 to MC22 may be coupled between the second word line WL1 and a plurality of second-layer bit lines BL10 to B12 arranged over the second word line WL1. The plurality of second-layer bit lines BL10 to BL12 may be arranged on the same plane to be spaced apart at a certain interval from each other and may extend to a direction crossing the second word line WL1. The plurality of second-layer bit lines BL10 to BL12 may extend in parallel to the plurality of first-layer bit lines BL00 to BL02. The plurality of third-layer variable resistance cells MC20 to MC22 may have the same configurations as the plurality of first-layer variable memory cells MC00 to MC02.

The fourth memory layer ML3 may be stacked on the third memory layer ML2, and may include a plurality of fourth-layer variable resistance cells MC30 to MC32. The plurality of fourth-layer variable resistance cells MC30 to MC32 may be coupled between the plurality of second-layer bit lines BL10 to BL12 and a third word line WL2. The third word line WL3 may be arranged over the plurality of second-layer bit lines BL11 to BL12 and may extend to a direction crossing the plurality of second-layer bit lines BL10 to BL12. The third word line WL2 may extend substantially in parallel to the first and second word lines WL0 and WL2. Each of the fourth-layer variable resistance cells MC30 to MC32 may have the same configurations as the second-layer variable resistance cells MC10 to MC12, and may be symmetrically arranged with the third-layer variable resistance cells MC20 to MC22 with respect to the second-layer bit lines BL10 to BL12.

For example, the first memory layer ML0 may be used as the memory unit 150 of the embodiment, and the second to fourth memory layers ML1 to ML3 may be used as the storage unit 180 of the embodiment.

In another example, the first memory layer ML0 may be used as both the memory unit 150 and the storage unit 180. That is, the memory unit 150 may be configured of the first memory layer ML0, and the storage unit 180 may be configured of the first to fourth memory layers ML0 to ML3.

Figure 7:
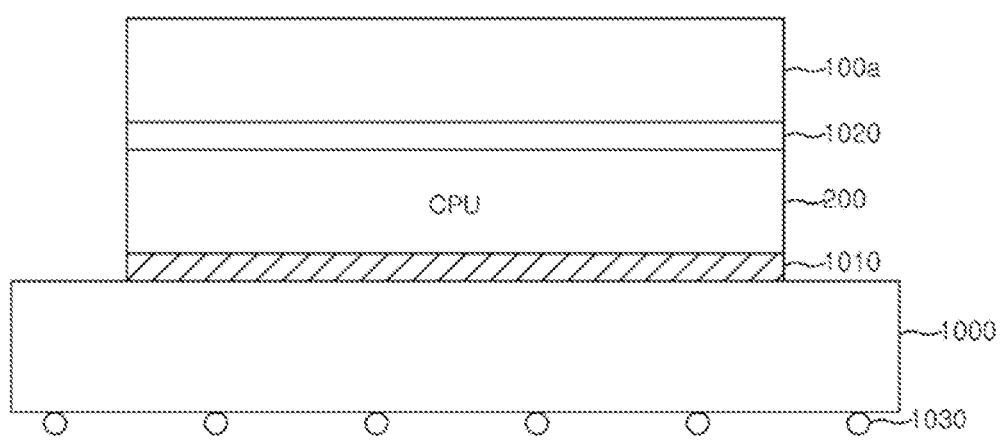
FIG. 7 is a cross-sectional diagram illustrating a stack package including a combined memory block, according to an exemplary embodiment of the present invention.

As the combined memory block 100 including the memory unit 150 and the storage unit 180 is formed in one type of stack memory structure, the combined memory block 100 may be packaged in one-chip form as illustrated in FIG. 7.

As illustrated in FIG. 7, the CPU 200 may be mounted on a printed circuit board (PCB) 1000. The CPU 200 may include the cache memory 201 and the control block 300 as illustrated in FIG. 5. In embodiments, the cache memory 201 and the control block 300 may be configured of individual chips. A memory chip 100a including the combined memory block 100 of FIG. 5 may be stacked on the CPU 200, and thus the stacking package may be completed. An adhesion layer 1010 may be disposed between one side of the PCB 1000 and the CPU 200, an interposer 1020 may be disposed between the CPU 200 and the memory chip 100a, and solder balls 1030 may be arranged on the other side of the PCB 1000.

According to an exemplary embodiment of the present invention, the memory unit 150 constituting the combined memory block 100 may be configured as the SLCs capable of turning on/off at high speed and the storage unit 180 implemented with the MLCs along with the SLCs of the memory unit 150 so that a storage function may be maximized.

Although the above-described exemplary embodiment has been illustrated so that the storage unit 180 implements MLCs by combining SLCs including the memory unit 150, according to another exemplary embodiment of the present invention, while the memory unit 150 may be SLCs, the storage unit 180 may implement MLCs by using storage units/memory units 181, 182, and 183 that are each configured as MLCs. In this case, the number of buffers 621, 622, and B23 of the control block 300 may be the same as the number of word lines.

It is noted, that the above-described embodiments are provided as examples of the invention only, and that the invention should not be limited to the described embodiments only. Many other embodiments, and or variations of the invention may be envisioned by those skilled in the art to which this invention pertains without departing from the spirit and scope of the invention as defined by the appended claims.

What is claimed is:

1. A data processing system comprising:
a central processing unit (CPU);
a control block configured to interface with the CPU;
a cache memory configured to interface with the control block and arranged to be spaced from the CPU by a first distance; and
a combined memory configured to interface with the control block, arranged to be spaced from the CPU by a second distance larger than the first distance, and comprising a working memory and a storage memory,
wherein the combined memory comprises a plurality of stacked memory layers, each memory layer comprising a plurality of variable resistance memory cells,
the working memory is allocated to one memory layer selected from among the plurality of memory layers and is controlled by a first controller so that the one memory is operated as the working memory, and
the storage memory is allocated to remaining memory layers among the plurality of memory layers and is controlled by a second controller so that the remaining memory layers are operated as the storage memory for performing a function being different from a function of the working memory,
wherein the combined memory is integrated on one chip, and the CPU is integrated on another chip being separated from the combined memory, and
wherein the control block includes the first controller and the second controller, the working memory is controlled by the first controller, and the storage memory is controlled by the second controller.

2. The data processing system of claim 1, wherein the memory layer includes:
a word line;
a plurality of bit lines stacked over the word line and extending to a direction crossing the word line; and
the plurality of variable resistance memory cells, each variable resistance memory cell being coupled between the word line and a corresponding bit line among the plurality of bit lines.

3. The data processing system of claim 2, wherein the variable resistance memory cell includes:
a switch coupled to the word line; and
a variable resistance layer coupled to the switch and the corresponding bit line.

4. The data processing system of claim 3, wherein the switch comprises a diode, a transistor, or an ovonic threshold switch (OTS).

5. The data processing system of claim 3, wherein the variable resistance layer comprises a phase-change memory layer.

6. The data processing system of claim 1, wherein the plurality of memory layers include the same type of variable resistances, respectively.

7. A data processing system comprising:
a central processing unit (CPU); and
a combined memory block configured to substantially interface with the CPU, the combined memory block comprising a working memory and a storage memory,
wherein the working memory and the storage memory are configured to be stacked in a plurality of memory layers to form one chip, and
wherein the CPU is integrated on another chip being separated from the combined memory,
wherein the combined memory block is configured in a form in which a plurality of memory layers are stacked,
wherein one selected from among the stacked memory layers is used as the working memory, and remaining memory layers are used as the storage memory,
wherein the one selected from among the stacked memory layers is controlled by a first controller so that the one is operated as the working memory, and
remaining memory layers are controlled by a second controller so that the remaining memory layers are operated as the storage memory for performing a function being different from a function of the working memory.

8. The data processing system of claim 7, wherein the stacked memory layers include:
a word line and a plurality of bit lines which are alternately stacked a plurality of times; and
variable resistance memory cells arranged at intersections of the word lines and the plurality of bit lines, each variable resistance memory cell being coupled to a corresponding word line and a corresponding bit line.

9. The data processing system of claim 8, wherein the variable resistance memory cell comprises:
a switch coupled to a corresponding word line; and
a variable resistance layer coupled to the switch and a corresponding bit line.

10. The data processing system of claim 9, wherein the switch comprises a diode, a transistor, or an ovonic threshold switch (OTS).

11. The data processing system of claim 9, wherein the variable resistance layer comprises a phase-change memory layer.

12. The data processing system of claim 7, wherein the plurality of memory layers include the same type of variable resistances, respectively.

13. A stack package comprising:
   a printed circuit board (PCB);
   a central processing unit (CPU) chip mounted on the PCB; and
   a combined memory chip stacked on the CPU chip and including a working memory and a storage memory,
   wherein the combined memory chip is configured in a form in which a plurality of memory layers are stacked, each memory layer including a plurality of memory cells,
   wherein a portion of the plurality of memory layers is driven as the working memory controlled by a first controller, and remaining memory layers are driven as the storage memory controlled by a second controller for performing a function being different from the first controller, and
   wherein the working memory and the storage memory are controlled by different controllers.

14. The stack package of claim 13, wherein a selected memory layer is driven as the working memory, and all the plurality of memory layers are driven as the storage memory.

15. The stack package of claim 13, further comprising an interposer configured to interface between the CPU chip and the combined memory chip.

16. The stack package of claim 13, wherein the plurality of memory layers include the same type of variable resistances, respectively.

* * * * *